US012615939B2

(12) United States Patent
Park

(10) Patent No.: US 12,615,939 B2
(45) Date of Patent: Apr. 28, 2026

(54) DISPLAY DEVICE

(71) Applicant: LG Display Co., Ltd., Seoul (KR)

(72) Inventor: Sunghee Park, Paju-si (KR)

(*) Notice: Subject to any disclaimer, the term of this patent is extended or adjusted under 35 U.S.C. 154(b) by 1176 days.

(21) Appl. No.: 17/545,782

(22) Filed: Dec. 8, 2021

(65) Prior Publication Data

US 2022/0181401 A1 Jun. 9, 2022

(30) Foreign Application Priority Data

Dec. 9, 2020 (KR) ........................ 10-2020-0171616

(51) Int. Cl.
| | |
|---|---|
| *H10K 59/35* | (2023.01) |
| *H10K 59/131* | (2023.01) |
| *H10K 59/38* | (2023.01) |
| *H10K 59/80* | (2023.01) |

(52) U.S. Cl.
CPC ......... *H10K 59/351* (2023.02); *H10K 59/131* (2023.02); *H10K 59/353* (2023.02); *H10K 59/38* (2023.02); *H10K 59/8792* (2023.02)

(58) Field of Classification Search
CPC ............... H10K 50/131; H10K 59/353; H10K 59/8792; G09G 3/3255
See application file for complete search history.

(56) References Cited

U.S. PATENT DOCUMENTS

| | | | |
|---|---|---|---|
| 2016/0219271 A1 | 7/2016 | Wei | |
| 2016/0254325 A1* | 9/2016 | Choi | H10K 59/351 |
| | | | 257/40 |
| 2016/0326647 A1* | 11/2016 | Rohatgi | C23C 14/04 |
| 2017/0053971 A1* | 2/2017 | Sato | H10K 59/131 |
| 2021/0286194 A1* | 9/2021 | Park | B32B 37/18 |

FOREIGN PATENT DOCUMENTS

| | | | | |
|---|---|---|---|---|
| KR | 20170022906 A | * | 3/2017 | ......... H01L 51/5215 |
| KR | 20170027362 A | | 3/2017 | |
| KR | 10-1868792 B1 | | 6/2018 | |
| KR | 10-1945428 B1 | | 2/2019 | |

* cited by examiner

*Primary Examiner* — Mounir S Amer
(74) *Attorney, Agent, or Firm* — Seed Intellectual Property Law Group LLP

(57) ABSTRACT

A display device includes: a pixel part in which sub-pixels are arranged, and at least one transparent part arranged in an area adjacent to the pixel part and passing external light therethrough, wherein the pixel part may be provided with first to fourth extension parts extending in directions different from each other and having shapes and configurations substantially similar to each other, the pixel part having a shape of a cross or pinwheel, and the sub-pixels may be arranged in the first to fourth extension parts, respectively.

14 Claims, 9 Drawing Sheets

DISPLAY DEVICE

CROSS REFERENCE TO RELATED APPLICATION

The present application claims priority to Korean Patent Application No. 10-2020-0171616, filed Dec. 9, 2020, the entire contents of which is incorporated herein for all purposes by this reference.

BACKGROUND

Technical Field

The present disclosure relates to a display device.

Description of the Related Art

An organic light emitting display device displays an image by using an organic light emitting diode that generates light by recombination of electrons and holes. The organic light emitting display device is a self-luminous display device and has a fast response speed and is driven with low power consumption, and thus is spotlighted as a next-generation display.

The organic light emitting display device may be configured as a transparent display device by making a transistor or a light emitting diode located inside the display device transparent or by separating a circuit part from a transparent part.

BRIEF SUMMARY

Some transparent display devices in the related art has a rectangular transparent part and has a transparency of about 40%. However, the inventors of the present disclosure have appreciated that the rectangular transparent part has diffraction at edges due to a ratio between width and height thereof having different lengths, respectively. Such diffraction causes haze, which reduces the sharpness of the display device. Accordingly, the inventors of the present disclosure have provided one or more embodiments of a display device in which a transparent part having a special shape is provided to reduce diffraction and haze.

Further embodiments are provided in the present disclosure that addresses one or more technical problems in the related art as well as the problems identified above.

In order to achieve the above technical benefits, according to one aspect of the present disclosure, there is provided a display device including: a pixel part in which sub-pixels are arranged, and at least one transparent part arranged in an area adjacent to the pixel part and passing external light therethrough, wherein the pixel part is provided with first to fourth extension parts extending in directions different from each other and having shapes and configurations substantially similar to each other, the pixel part having a shape of a cross or pinwheel, and the sub-pixels are arranged in the first to fourth extension parts, respectively.

Each of the first to fourth extension parts may include: a circuit part in which circuit elements are arranged; a wiring part in which wires configured to apply electrical signals to the circuit elements are arranged; and at least one light emitting part arranged by overlapping each of the circuit part and the wiring part and comprising a light emitting diode.

Each of the first to fourth extension parts may have shape and structure rotating 90° relative to adjacent extension parts.

The at least one transparent part may have a shape of a square in which two sides are defined by two adjacent extension parts of the first to fourth extension parts.

The wires may include: a first power line configured to apply a high potential drive voltage to the sub-pixels, and a second power line configured to apply a low potential drive voltage to the sub-pixels, wherein each of the first power line and the second power line comprises a first pattern extending along a first axis via a wiring part of each of the first extension part and the second extension part, and at least one of the first power line and the second power line comprises a second pattern extending along a second axis overlapping with the first axis via a wiring part of each of the third extension part and the fourth extension part.

The wires may include: a first power line configured to apply a high potential drive voltage to the sub-pixels, and a second power line configured to apply a low potential drive voltage to the sub-pixels, wherein each of the first power line and the second power line comprises a second pattern extending along a second axis via a wiring part of each of the third extension part and the fourth extension part, and at least one of the first power line and the second power line comprises a first pattern extending along a first axis overlapping with the second axis via a wiring part of each of the first extension part and the second extension part.

When any one of the first power line and the second power line comprises the second pattern, the second pattern may have a width larger than a width of the first pattern.

The wires may include: a gate line configured to apply a gate signal to the sub-pixels and to extend along a first axis, and a data line configured to apply a data signal to the sub-pixels and to extend along a second axis overlapping with the first axis.

The data line may include: a first sub-data line connected with sub-pixels arranged in some portions of the first to fourth extension parts, and a second sub-data line arranged by being spaced apart from the first sub-data line and connected with sub-pixels arranged in the remaining portions of the first to fourth extension parts.

The pixel part may include: a substrate on which red, green, blue and white sub-pixels are arranged; a color filter arranged by corresponding to the light emitting part of each of the red, green, and blue sub-pixels; and a black matrix arranged between adjacent color filters, wherein the black matrix is not arranged on the white sub-pixel.

According to another aspect of the present disclosure, there is provided a transparent display device including: a display panel in which unit pixels are arranged, wherein each of the unit pixels comprises: a pixel part in which sub-pixels are arranged, and at least one transparent part arranged in an area adjacent to the pixel part and passing external light therethrough, wherein the pixel part is provided with first to fourth extension parts extending in directions different from each other and having shapes and configurations substantially similar to each other, the pixel part having a shape of a cross or pinwheel, and the sub-pixels are arranged in the first to fourth extension parts, respectively.

The first to fourth extension parts may include: a circuit part in which circuit elements are arranged; a wiring part in which wires configured to apply electrical signals to the circuit elements are arranged; and at least one light emitting part arranged by overlapping each of the circuit part and the wiring part and comprising a light emitting diode.

Each of the first to fourth extension parts may have shape and structure rotating 90° relative to adjacent extension parts.

The at least one transparent part may have a shape of a square in which two sides are defined by two adjacent extension parts of the first to fourth extension parts.

The wires may include: a first power line configured to apply a high potential drive voltage to the sub-pixels, and a second power line configured to apply a low potential drive voltage to the sub-pixels, wherein each of the first power line and the second power line may include a first pattern extending along a first axis and a second pattern extending along a second axis to have a mesh structure.

The first pattern of each of the first power line and the second power line may be arranged via a wiring part of each of the first extension part and the second extension part, and the second pattern of each of the first power line and the second power line may be arranged via a wiring part of each of the third extension part and the fourth extension part.

The first pattern of each of the first power line and the second power line may be arranged in each of unit pixel rows, and the second pattern of each of the first power line and the second power line may be alternately arranged in each of unit pixel columns.

The second pattern of each of the first power line and the second power line may have a width larger than the width of the first pattern of each of the first power line and the second power line.

The wires may include: the gate line configured to apply the gate signal to the sub-pixels and to extend along the first axis, and the data line configured to apply the data signal to the sub-pixels and to extend along the second axis overlapping with the first axis.

The pixel part may include: a substrate on which red, green, blue and white sub-pixels are arranged; a color filter arranged by corresponding to the light emitting part of each of the red, green, and blue sub-pixels; and a black matrix arranged between adjacent color filters, wherein the black matrix may not be arranged on the white sub-pixel.

In the display device according to the embodiments, a cross-shaped pixel part is provided. In addition, the transparent display device including pixels according to the embodiments approximates a ratio between the width and height of the transparent part to 1:1 by arranging power lines such that the power lines have a mesh structure.

In the display device according to the embodiments, due to such a structure, diffraction and haze at the edge of the transparent part can be reduced. In addition, the display device according to the embodiments has the same definition as the definition of a display device having a conventional rectangular transparent part and has improved sharpness, thereby improving visibility of the background of the rear surface of the display device.

In the display device according to the embodiments, a black matrix arranged on a white pixel is removed, thereby further improving sharpness.

In the display device according to the embodiments, the light emitting part is formed in a rectangular form, thereby reducing or minimizing the loss of light emitted from the light emitting part.

BRIEF DESCRIPTION OF THE SEVERAL VIEWS OF THE DRAWINGS

The above and other features, and other advantages of the present disclosure will be more clearly understood from the following detailed description when taken in conjunction with the accompanying drawings, in which:

FIG. 8 is a top plan view roughly illustrating the structure of the unit pixel according to another embodiment;

DETAILED DESCRIPTION

Figure 1:
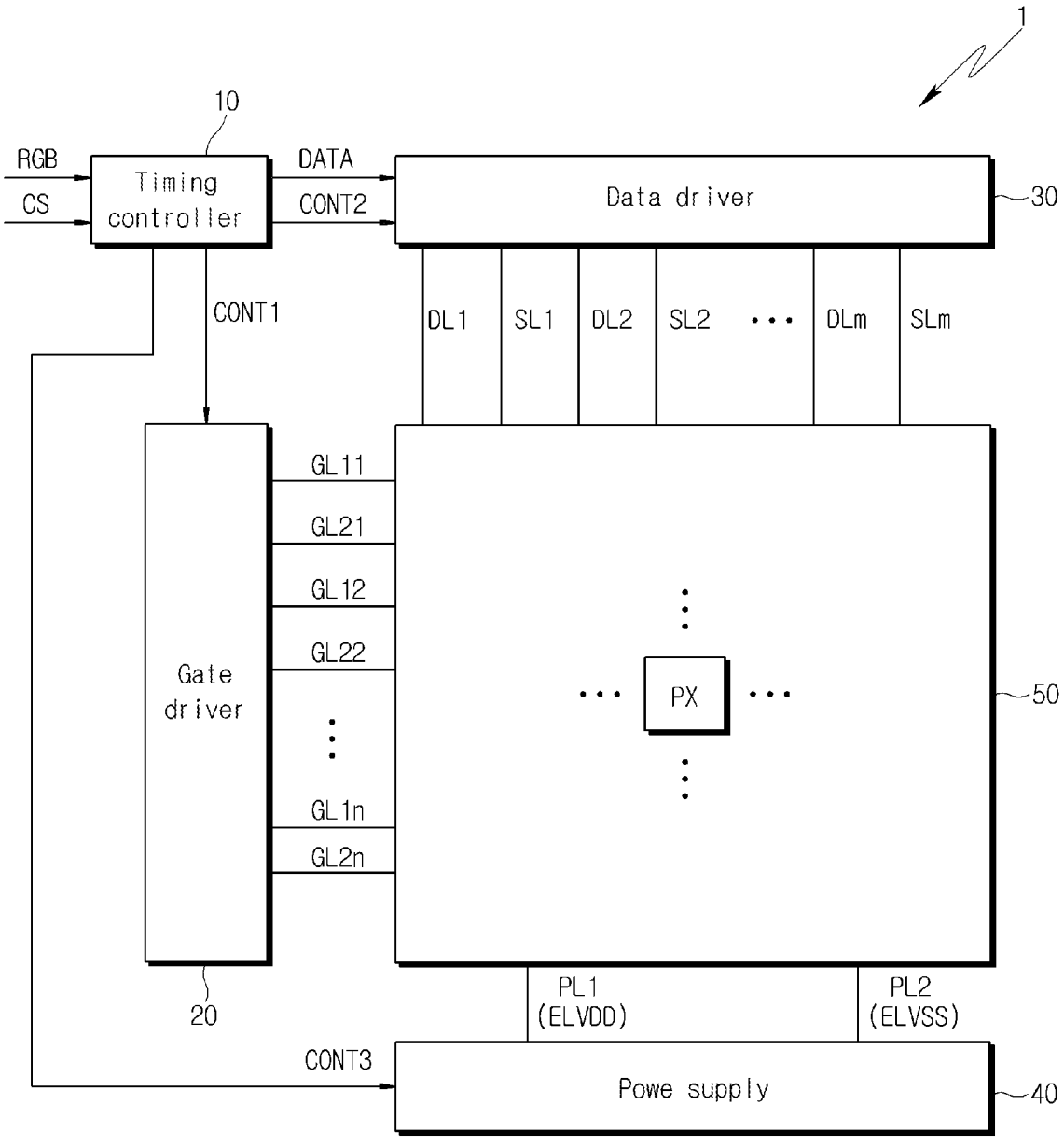
FIG. 1 is a block diagram illustrating the configuration of a display device according to an embodiment.

Hereinafter, embodiments of the present disclosure will be described with reference to the accompanying drawings. In this specification, when a component (or an area, layer, or portion, etc.) is referred to as being "on," "connected to," or "coupled to" another component, it means that the component can be directly connected/coupled to other components or that a third component can be disposed therebetween.

Like reference numerals refer to like elements. In addition, in the drawings, the thicknesses, proportions, and dimensions of components are exaggerated for effective description of technical content. "And/or" includes any combination of one or more that the associated configurations may define.

Terms such as first and second, etc., may be used to describe various elements, but the elements are not limited to the terms. The above terms are used only for the purpose of distinguishing one component from another component. For example, without departing from the scope of the present disclosure, the first component may be referred to as the second component. Similarly, the second component may also be referred to as the first component. A singular expression includes a plural expression unless the context clearly dictates otherwise.

Terms such as "under," "at a lower side," "on," "at an upper side" are used to describe the relationship of the components shown in the drawings. The above terms have relative concepts and are described with reference to directions indicated in the drawings.

Terms such as "comprise" or "have" are intended to designate that a feature, number, step, operation, component, or combination thereof described in the specification is present, and it should be understood that the terms do not preclude the possibility of addition or existence of one or more other features or numbers, steps, operations, components, or combinations thereof.

FIG. 1 is a block diagram illustrating the configuration of a display device according to an embodiment.

Referring to FIG. 1, the display device 1 includes a timing controller 10, a gate driver 20, a data driver 30, a power supplier 40, and a display panel 50.

The timing controller 10 can receive an image signal RGB and a control signal CS from the outside. The image signal RGB may include a plurality of gradation data. The control signal CS, for example, may include a horizontal sync signal, a vertical sync signal, and a main clock signal.

The timing controller 10 processes the image signal RGB and the control signal CS such that the image signal RGB and the control signal CS suit the operation condition of the display panel 50 and can generate and output image data DATA, a gate drive control signal CONT1, a data drive control signal CONT2, and a power supply control signal CONT3.

The gate driver 20 can be connected with sub-pixels sP of the display panel 50 through a plurality of first gate lines GL11 to GL1$n$. The gate driver 20 can generate gate signals on the basis of the gate drive control signal CONT1 output from the timing controller 10. The gate driver 20 can provide the generated gate signals to the sub-pixels sP through the plurality of first gate lines GL11 to GL1$n$.

In various embodiments, the gate driver 20 may further be connected with the sub-pixels sP of the display panel 50 through a plurality of second gate lines GL21 to GL2$n$. The gate driver 20 can provide a sensing signal to the sub-pixels sP through the plurality of second gate lines GL21 to GL2$n$. The sensing signal may be provided to the sub-pixels so as to measure the characteristics of a drive transistor and/or a light emitting diode provided inside the sub-pixels sP.

The data driver 30 may be connected with the sub-pixels sP of the display panel 50 through a plurality of data lines DL1 to DLm. The data driver 30 can generate data signals on the basis of the image data DATA and the data drive control signal CONT2 output from the timing controller 10. The data driver 30 can provide the generated data signals to the sub-pixels sP through the plurality of data lines DL1 to DLm.

In various embodiments, the data driver 30 may further be connected with the sub-pixels sP of the display panel 50 through the plurality of sensing lines SL1 to SLm (or, reference lines). The data driver 30 may provide a reference voltage (or, a sensing voltage or an initialized voltage) to the sub-pixels sP through the plurality of sensing lines SL1 to SLm, or may detect the state of each of the sub-pixels sP on the basis of an electrical signal fed back from the sub-pixel sP.

The power supplier 40 may be connected with the sub-pixels sP of the display panel 50 through a plurality of power lines PL1 and PL2. The power supplier 40 may generate a drive voltage to be provided to the display panel 50 on the basis of the power supply control signal CONT3. For example, the drive voltage may include a high potential drive voltage ELVDD and a low potential drive voltage ELVSS. The power supplier 40 may provide the generated drive voltages ELVDD and ELVSS to the sub-pixels sP through the power lines PL1 and PL2 corresponding to the power supplier 40.

A plurality of sub-pixels sP is arranged in the display panel 50. For example, the sub-pixels sP may be arranged in a matrix form on the display panel 50.

Each of the sub-pixels sP may be electrically connected to the gate line and the data line which correspond thereto. Such a sub-pixel sP can emit light with luminance corresponding to gate signals and data signals supplied through the first gate lines GL11 to GL1$n$ and the data lines DL1 to DLm, respectively.

The sub-pixels sP may display any one of the first to third colors. In the embodiment, each of the sub-pixels sP may display any one of red, green, and blue colors. In another embodiment, each of the sub-pixels sP may display any one of cyan, magenta, and yellow colors. In various embodiments, the sub-pixels sP may be configured to display any one of four or more colors. For example, each of the sub-pixels sP may display any one of red, green, blue, and white colors.

The timing controller 10, the gate driver 20, the data driver 30, and the power supplier 40 may be configured as individual integrated circuits (IC), respectively, or may be configured as integrated circuits having at least some of the timing controller 10, the gate driver 20, the data driver 30, and the power supplier 40 integrated with each other. For example, at least one of the data driver 30 and the power supplier 40 may be configured as an integrated circuit integrated with the timing controller 10.

In addition, in FIG. 1, the gate driver 20 and the data driver 30 are illustrated as components separate from the display panel 50, but at least one of the gate driver 20 and the data driver 30 may be configured to be integrated with the display panel 50 according to an in panel type. For example, the gate driver 20 may be configured to be integrated with the display panel 50 according to a gate in panel (GIP).

Figure 2:
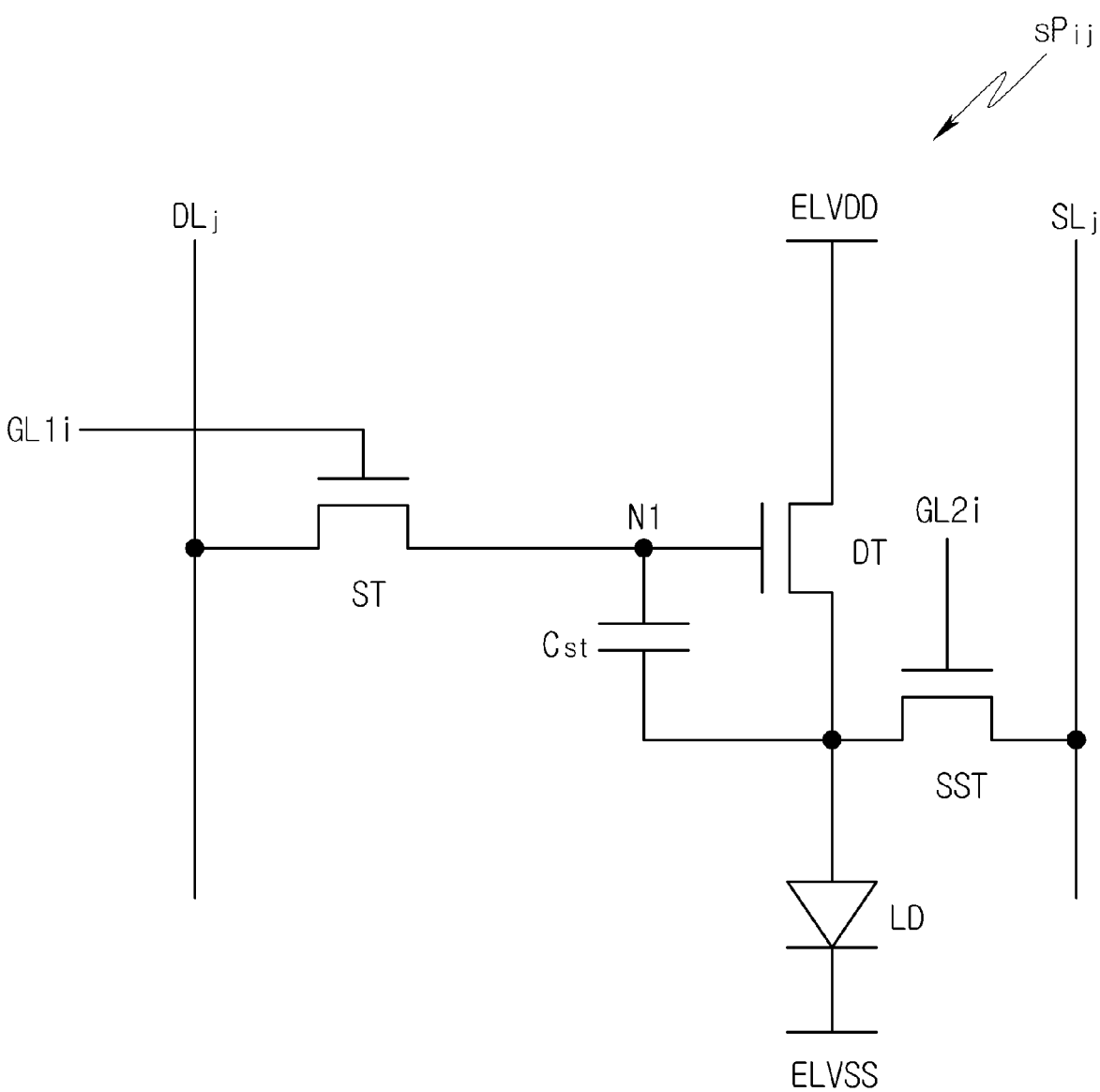
FIG. 2 is a circuit diagram of a sub-pixel illustrated in FIG. 1 according to the embodiment.

FIG. 2 is a circuit diagram of a sub-pixel illustrated in FIG. 1 according to the embodiment. FIG. 2 illustrates the sub-pixel sPij connected to i$^{th}$ gate lines GL1$i$ and GL2$i$ and a j$^{the}$ data line DLj.

Referring to FIG. 2, the sub-pixel sPij includes a switching transistor ST, a drive transistor DT, a sensing transistor SST, a storage capacitor Cst, and a light emitting diode LD.

The first electrode (for example, a drain electrode) of the switching transistor ST is electrically connected with a j$^{th}$ data line DLj, and the second electrode thereof (for example, a source electrode) is electrically connected with a first node N1. The gate electrode of the switching transistor ST is electrically connected with the i$^{th}$ first gate line GL1$i$. When the gate signal of a gate on level is applied to the ith first gate line GL1$i$, the switching transistor ST is turned on and transmits a data signal applied to the j$^{th}$ data line DLj to the first node N1.

The first electrode of the storage capacitor Cst is electrically connected with the first node N1, and the second electrode thereof is connected to the first electrode of the light emitting diode LD. The storage capacitor Cst can charge a voltage corresponding to difference between a voltage applied to the first node N1 and a voltage applied to the first electrode of the light emitting diode LD.

The first electrode (for example, a drain electrode) of the drive transistor DT is configured to receive the high potential drive voltage ELVDD, and the second electrode thereof (for example, a source electrode) is electrically connected to the first electrode (for example, an anode electrode) of the light emitting diode LD. The gate electrode of the drive transistor DT is electrically connected to the first node N1. The drive transistor DT is turned on when the voltage of the gate on level is applied to the gate electrode through the first node N1 and can control the amount of drive current flowing through the light emitting diode LD in response to the voltage supplied to the gate electrode.

The first electrode (for example, the drain electrode) of the sensing transistor SST is electrically connected with a i$^{th}$ sensing line SLj, and the second electrode thereof (for example, the source electrode) is electrically connected to the first electrode (for example, an anode electrode) of the light emitting diode LD. The gate electrode of the sensing transistor SST is electrically connected to the i$^{th}$ second gate line GL2$i$. When the sensing signal of the gate on level is applied to the i$^{th}$ second gate line GL2$i$, the sensing transistor SST is turned on and transmits the reference voltage Vref applied to the j$^{th}$ sensing line SLj to the first electrode of the light emitting diode LD.

The light emitting diode LD outputs light corresponding to the drive current. The light emitting diode LD may be an organic light emitting diode (OLED) or a micro inorganic light emitting diode having a size ranging from micro to nano scale, but is not limited thereto in the embodiment of the present disclosure. Hereinafter, the technical idea of the embodiment of the present disclosure will be described with reference to the embodiment in which the light emitting diode LD is configured as the organic light emitting diode.

In the embodiment of the present disclosure, the structure of the sub-pixel sPij is not limited to the structure illustrated in FIG. 2. According to the embodiment, the sub-pixel sPij may further include at least one element so as to compensate for the threshold voltage of the drive transistor DT, or so as to initialize the voltage of the gate electrode of the drive transistor DT and/or the voltage of the first electrode of the light emitting diode LD.

In FIG. 2, the switching transistor ST, the drive transistor DT, and the sensing transistor SST are illustrated as an NMOS transistor, but the display device of the present disclosure is not limited thereto. For example, at least some or all of transistors constituting each of the sub-pixels sP may be configured as a PMOS transistor. In various embodiments, each of the switching transistor ST, the drive transistor DT, and the sensing transistor SST may be configured as a low temperature poly silicon (LTPS) thin film transistor, an oxide thin film transistor, or a low temperature polycrystalline oxide (LTPO) thin film transistor.

Figure 3:
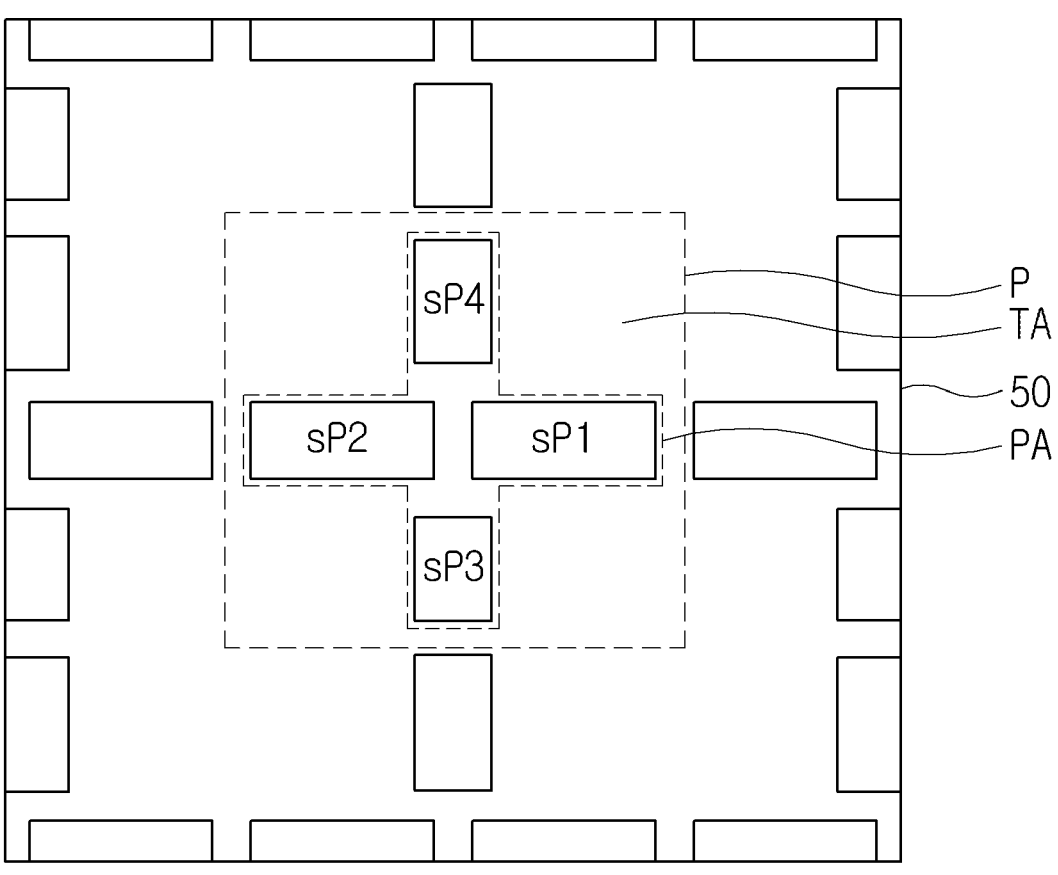
FIG. 3 is a top plan view illustrating a display panel according to the embodiment.

FIG. 3 is a top plan view illustrating a display panel according to the embodiment.

Referring to FIG. 3, one unit pixel P includes a pixel part PA in which the sub-pixels sP1, sP2, sP3, and sP4 displaying colors different from each other are arranged, and a transparent part TA arranged adjacently to the pixel part PA. The pixel part PA and the transparent part TA may be continuously arranged without physical separation. The number of sub-pixels included in one unit pixel P may be three or four but is not limited thereto.

In one pixel P, the sub-pixels sP1, sP2, sP3, and sP4 are arranged in the pixel part PA. In various embodiments, the pixel part PA may be provided with extension parts extending in different directions, respectively, and having a cross shape (that is, a pinwheel shape). In this embodiment, one sub-pixel may be arranged in one extension part. Hereinafter, the structure of the pixel part PA will be described in more detail with reference to drawings.

The transparent part TA is the remaining area that excludes the pixel part PA and is an area in which the sub-pixels sP1, sP2, sP3, and sP4 are not arranged. Such a transparent part TA may be arranged between two adjacent extension parts. That is, the transparent part TA may be formed in the form of a square in which two sides are defined by two adjacent extension parts. The transparent part TA passes light therethrough and may be formed to be transparent or translucent such that incident light passes through the transparent part. Accordingly, in some embodiments, transparent or translucent materials may be used for layers stacked on the transparent part TA.

Through the structure of the unit pixel P including the transparent part TA, the display panel 50 may function as a transparent display device.

Figure 4:
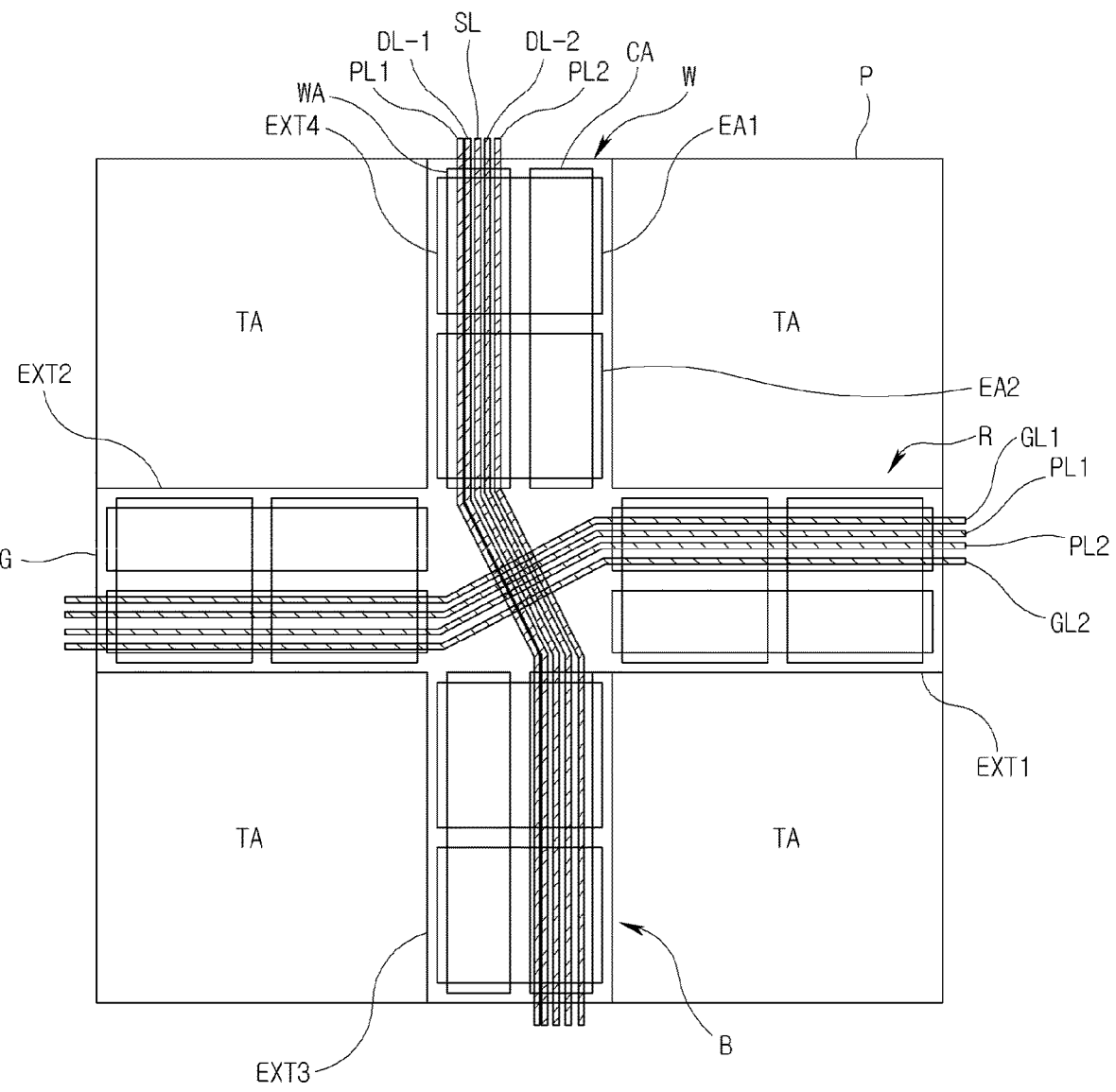
FIG. 4 is a top plan view roughly illustrating the structure of the unit pixel according to the embodiment.

FIG. 4 is a top plan view roughly illustrating the structure of the unit pixel according to the embodiment.

Referring to FIG. 4, under a pixel arrangement structure based on four sub-pixels, the unit pixel P may include the sub-pixels R, G, B, and W that emit red, green, blue, and white lights, respectively. Each of the sub-pixels R, G, B, and W may be arranged at a selected or predetermined position in the pixel part PA of the unit pixel P. An area in which light is emitted by each of the sub-pixels R, G, B, and W may be defined as the light emitting part EA1 or EA2. In the unit pixel P, the transparent part TA may be formed in an area that excludes the pixel part PA.

The pixel part PA may have a shape of a cross or pinwheel. That is, the pixel part PA is provided with first to fourth extension parts EXT1 to EXT4 extending in directions different from each other. The sub-pixels R, G, B, and W may be arranged in the extension parts EXT1 to EXT4, respectively. For example, the red sub-pixel R may be arranged in a first extension part EXT1, the green sub-pixel G may be arranged in a second extension part EXT2, the blue sub-pixel B may be arranged in a third extension part EXT3, and the white sub-pixel W may be arranged in a fourth extension part EXT4.

A circuit part CA, a wiring part WA, and at least one light emitting part EA1 or EA2 may be arranged in each of the extension parts EXT1 to EXT4. In the illustrated embodiment, the light emitting part EA1 or EA2 includes two light emitting parts but is not limited thereto in the embodiment of the present disclosure, and one light emitting part or two or more light emitting parts may be provided.

The circuit part CA is arranged in an area of each of the extension parts EXT1 to EXT4. Circuit elements constituting each of the sub-pixels R, G, B, and W are arranged in the circuit part CA. For example, the circuit elements may include the drive transistor DT, the switching transistor ST, the sensing transistor SST, and the storage capacitor Cst described with reference to FIG. 2.

In each of the extension parts EXT1 to EXT4, the wiring part WA is arranged in the remaining area which the circuit part CA is not arranged. The wiring part WA has wires arranged therein so as to apply signals to the circuit elements arranged in the circuit part CA. For example, the wires may include the gate lines GL1 and GL2, the data line DL, the sensing line SL, and the power lines PL1 and PL2 described with reference to FIG. 2.

Each of the sub-pixels R, G, B, and W emits light through the light emitting diode LD arranged in the light emitting part EA1 or EA2. In the embodiment of the present disclosure, each of the sub-pixels R, G, B, and W may include two light emitting parts EA1 and EA2. The light emitting part EA1 or EA2 of a sub-pixel is arranged by overlapping the circuit part CA and the wiring part WA of the sub-pixel. When each of the sub-pixels R, G, B, and W has a plurality of light emitting parts EA1 and EA2, each of the plurality of light emitting parts EA1 and EA2 may overlap the circuit part CA and the wiring part WA. Accordingly, when the light emitting parts EA1 and EA2 of a sub-pixel are arranged by overlapping the circuit part CA and the wiring part WA of the sub-pixel, the occurrence of a parasitic capacitor between adjacent sub-pixels can be prevented.

In the embodiment of the present disclosure, each of the extension parts EXT1 to EXT4 may have shape, area, and structure substantially similar to each other. For example, circuit elements, wires, and light emitting diodes located in the extension parts EXT1 to EXT4 may have substantially similar shapes and areas and may be arranged at the same location in each of the extension parts EXT1 to EXT4. However, the embodiment of the present disclosure is not limited thereto, and the circuit elements, the wires, and the light emitting diodes located in each of the extension parts EXT1 to EXT4 may have different shapes and areas.

Instead, since the extension parts EXT1 to EXT4 extend in four different directions, respectively, each of the extension parts EXT1 to EXT4 has a shape and structure rotating about 90° relative to another extension part adjacent to the extension part. That is, the first extension part EXT1 has a shape rotating about 90° clockwise relative to the fourth extension part EXT4; the third extension part EXT3 has a shape rotating about 90° clockwise relative to the first extension part EXT1; the second extension part EXT2 has a shape rotating about 90° clockwise relative to the third extension part EXT3; and the fourth extension part EXT4 has a shape rotating about 90° clockwise relative to the second extension part EXT2.

In addition, the wires having the same shapes and structures in the extension parts EXT1 to EXT4 may apply the same signals or different signals. For example, the first and second gate lines GL1 and GL2 configured to apply the first and second gate signals and the power lines PL1 and PL2 are arranged in the first and second extension parts EXT1 and EXT2, and the data line DL configured to apply the data signal, the sensing line SL configured to apply the reference voltage Vref, and the power lines PL1 and PL2 may be arranged in the third and fourth extension parts EXT3 and EXT4.

The extension parts EXT1 to EXT4 have shapes and structures (configurations) substantially similar to each other, so the sub-pixels R, G, B, and W can be equally designed in the same way, and deviation between the sub-pixels R, G, B, and W can be reduced or minimized. In addition, when changing a circuit, such as changing the size of a transistor, it is easy to modify all the sub-pixels R, G, B, and W, so the degree of the design freedom of the display panel 50 can be improved.

Hereinafter, the planar structure and stacked structure (a cross-section structure) of the pixel part PA according to the embodiment will be described in more detail with reference to the following drawings.

Figure 5:
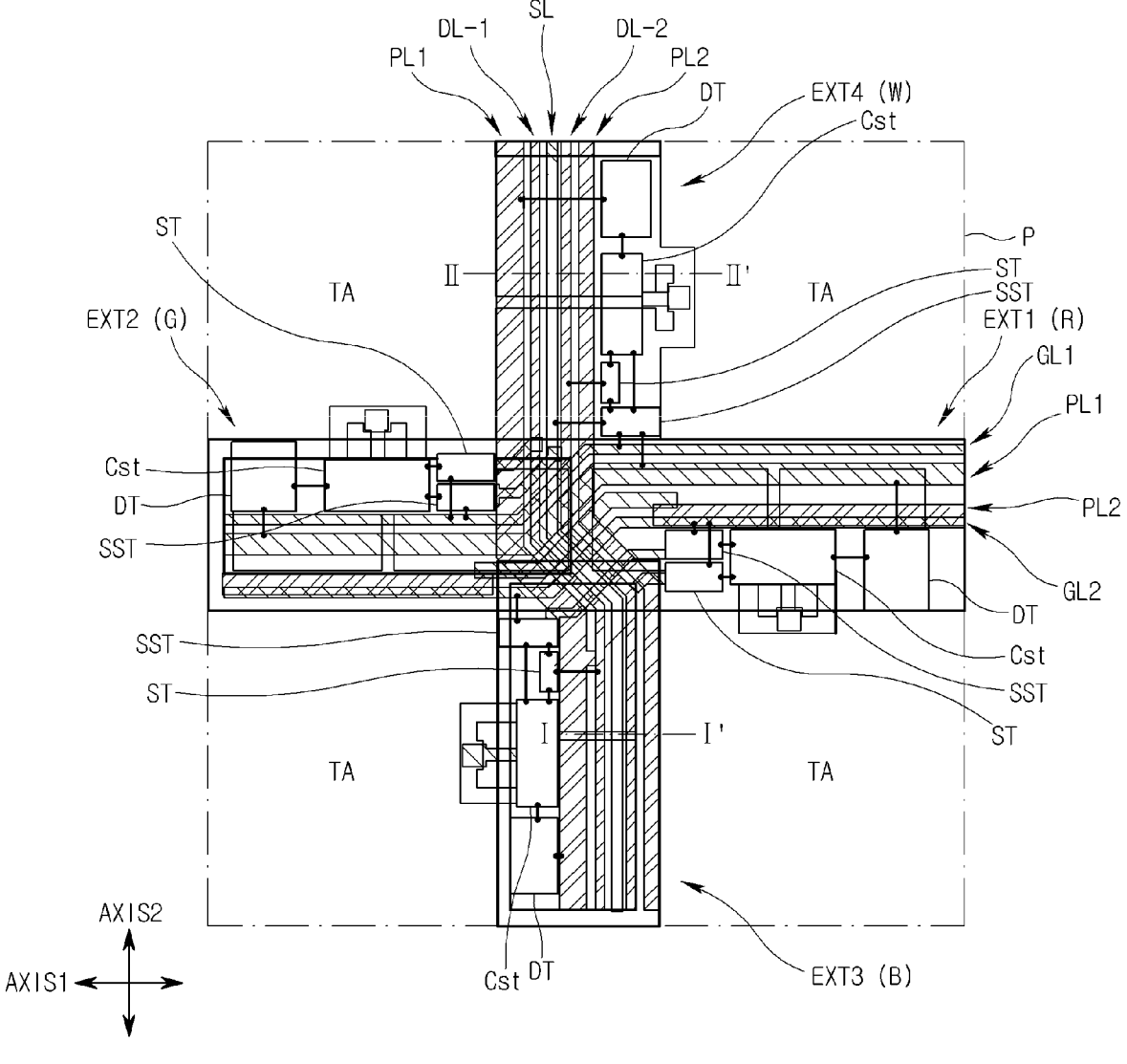
FIG. 5 a top plan view illustrating, in detail, the structure of the unit pixel illustrated in FIG. 4.
Figure 6:
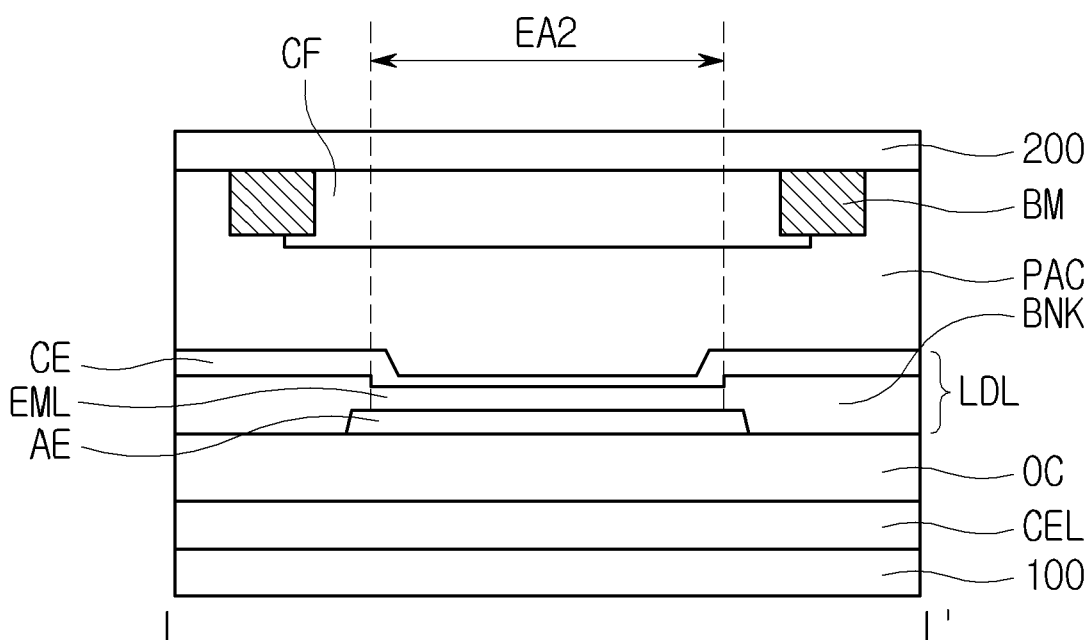
FIG. 6 is a sectional view taken along line I-I' of FIG. 5.
Figure 7:
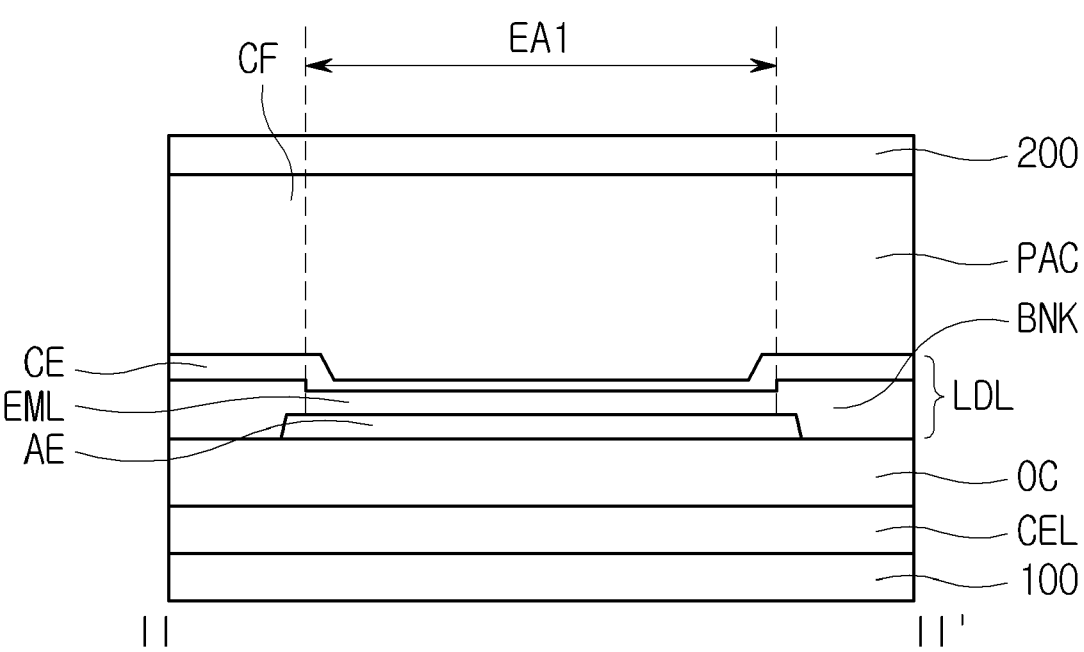
FIG. 7 is a sectional view taken along line II-IP of FIG. 5.

FIG. 5 a top plan view illustrating, in detail, the structure of the unit pixel illustrated in FIG. 4; FIG. 6 is a sectional view taken along line I-I' of FIG. 5; and FIG. 7 is a sectional view taken along line II-IP of FIG. 5.

Referring to FIG. 5 together with FIG. 4, the unit pixel P includes the pixel part PA in which the sub-pixels R, G, B, and W are arranged and transparent parts TA which are the remaining area in which the sub-pixels R, G, B, and W are not arranged.

The pixel part PA may have a shape of a cross or pinwheel. As illustrated in the drawing, the pixel part PA includes the first and second extension parts EXT1 and EXT2 extending in directions opposite to each other along a first axis AXIS1, and the third and fourth extension parts EXT3 and EXT4 extending in directions opposite to each other along a second axis AXIS2 perpendicular to the first axis AXIS1.

The sub-pixels R, G, B, and W may be arranged in the extension parts EXT1 to EXT4, respectively. For example, the red sub-pixel R may be arranged in the first extension part EXT1, the green sub-pixel G may be arranged in the second extension part EXT2, the blue sub-pixel B may be arranged in the third extension part EXT3, and the white sub-pixel W may be arranged in the fourth extension part EXT4.

Each of the extension parts EXT1 to EXT4 may include: the light emitting part EA1 or EA2 in which the light emitting diode LD is arranged; the circuit part CA in which the circuit elements (for example, a drive transistor DT, a switching transistor ST, a sensing transistor SST, and a storage capacitor Cst) configured to operate the light emitting diode LD are arranged; and the wiring part WA in which the wires (for example, the data line DL, the sensing line SL, and the power lines PL1 and PL2) configured to apply electrical signals to the circuit elements arranged in the circuit part CA are arranged. The circuit elements may control the amount of current applied to the light emitting diode LD in response to the electrical signals applied through the wires, and the light emitting diode LD may emit light with luminance corresponding to the amount of the current applied by the circuit elements.

The circuit part CA is arranged in an area of each of the extension parts EXT1 to EXT4. An active layer constituting the transistors, the source, drain, and gate electrodes, and electrodes constituting the capacitor may be arranged in the circuit part CA. The transistors and the electrodes of the capacitor may be electrically connected with the wires formed in the wiring part WA through a contact hole.

In each of the extension parts EXT1 to EXT4, the wiring part WA is arranged in the remaining area in which the circuit part CA is not arranged. The first and second gate lines GL1 and GL2 extending along the first axis AXIS1 and the data line DL and the sensing line SL extending along the second axis AXIS2 are arranged in the wiring parts WA, respectively. For example, the first and second gate lines GL1 and GL2 extend via the wiring parts WA of the first and second extension parts EXT1 and EXT2 extending along the first axis AXIS1, and the data line DL and the sensing line SL extend via the wiring parts WA of the third and fourth extension parts EXT3 and EXT4 extending along the second axis AXIS2.

In the embodiment of the present disclosure, the data line DL may include a first sub-data line DL-1 configured to apply a data signal to the pixels G and W arranged in the second and fourth extension parts EXT2 and EXT4 and a second sub-data line DL-2 configured to apply a data signal to the pixels R and B arranged in the first and third extension parts EXT1 and EXT3.

An overlapping part may be formed at a position at which the first and second gate lines GL1 and GL2 and the data line DL/sensing line SL overlap with each other. In the embodiment, the data line DL and the sensing line SL arranged in the third and fourth extension parts EXT3 and EXT4 can be connected with the circuit elements arranged in the first and second extension parts EXT1 and EXT2 through the contact hole formed in the overlapping part. Similarly, the gate lines GL1 and GL2 arranged in the first and second extension parts EXT1 and EXT2 can be connected with the circuit elements arranged in the third and fourth extension parts EXT3 and EXT4 through the contact hole formed in the overlapping part.

Power lines PL1 and PL2 are arranged in the wiring part WA. Each of the first power line PL1 and the second power line PL2 may extend along the first axis AXIS1 and the second axis AXIS2 to have a mesh structure. In this embodiment, each of the first power line PL1 and the second power line PL2 has a first pattern extending along the first axis AXIS1 in the wiring part WA of each of the first and second extension parts EXT1 and EXT2, and a second pattern extending along the second axis AXIS2 in the wiring part WA of each of the third and fourth extension parts EXT3 and EXT4. The first pattern and the second pattern can be connected with each other through the contact hole formed in at least any one of the overlapping part or each of the extension parts EXT1 to EXT4. In addition, the first power line PL1 and the second power line PL2 can be connected with the circuit elements through the contact hole formed in the overlapping part or each of the extension parts EXT1 to EXT4.

In general, the first power line PL1, which applies the high potential drive voltage ELVDD, may be thicker than other wires. Accordingly, when the first power line PL1 is arranged only in some portions of the extension parts EXT1 to EXT4, each width of the extension parts EXT1 to EXT4 is set to be different from each other, so the extension parts EXT1 to EXT4 may not have shapes substantially similar to each other.

In the embodiment of the present disclosure, each of the first power line PL1 and the second power line PL2 has a mesh structure by being arranged in all extension parts EXT1 to EXT4, so the number and entire width of the wires arranged in each of the wiring parts WA of all the extension parts EXT1 to EXT4 may be configured to be the same. As a result, due to each of the first power line PL1 and the second power line PL2 having the mesh structure, all the extension parts EXT1 to EXT4 may have shapes and structures substantially similar to each other.

However, the embodiment of the present disclosure is not limited thereto. That is, in various other embodiments, the first pattern of at least one of the first power line PL1 and the second power line PL2 may be omitted in a pixel P.

When each of the extension parts EXT1 to EXT4 has the same shape, the lengths of the first axis AXIS1 and the second axis AXIS2 of the transparent part TA arranged in an area adjacent to the pixel part PA are the same. That is, in the embodiment of the present disclosure, a ratio between the width and height of the transparent parts TA may be set to be 1:1. Accordingly, when the transparent part TA has the shape of a square overall, diffraction of light at the edge of the transparent part TA can be reduced or minimized, and as a result, a haze at the edge of the transparent part can be reduced. This improves the overall sharpness of the display panel 50.

The light emitting part EA1 or EA2 is arranged on the circuit part CA and the wiring part WA by overlapping the circuit part CA and the wiring part WA. The light emitting diode LD is arranged in the light emitting part EA1 or EA2. In the embodiment of the present disclosure, each of the sub-pixels R, G, B, and W may include two light emitting parts EA1 and EA2. The light emitting parts EA1 and EA2 are electrically connected to the drive transistor DT and receive drive current via the drive transistor DT.

Hereinafter, the stacked structure (a cross-section structure) of the unit pixel P illustrated FIG. 5 will be described.

Referring to FIGS. 6 and 7, the unit pixel P may include a substrate 100, and a circuit element layer CEL and a light emitting diode layer LDL which are arranged on the substrate 100.

The substrate 100 as a base of the display panel 50 may be a substrate which passes light therethrough. The substrate 100 may be a rigid substrate including glass or tempered glass or may be a flexible substrate made of plastic. For example, the substrate 100 may be made of a plastic material such as polyimide, polyethylene terephthalate (PET), polyethylene naphthalate (PEN), and polycarbonate (PC). However, the material of the substrate 100 is not limited to the materials described above.

At least one transistor and a capacitor as the circuit elements constituting each of the sub-pixels R, G, B, and W and wires may be arranged at the circuit element layer CEL. A transparent insulating layer may be arranged between electrodes constituting each of the circuit elements such that the electrodes can be electrically insulated therebetween. The circuit element may be covered with a passivation layer and be protected from foreign matter.

An overcoat layer OC may be formed on the circuit element layer CEL. The overcoat layer OC may be a planarization film configured to alleviate the step of a lower structure, and may be made of an organic material such as polyimide, benzocyclobutene series resin, or acrylate.

The light emitting diode layer LDL is formed on the overcoat layer OC and includes the light emitting diodes LD. Each of the light emitting diodes LD includes an anode electrode AE, a light emitting layer EML, and a cathode electrode CE. In a case in which the display panel 50 is a display panel emitting light at a front surface thereof, the anode electrode AE may be a reflective electrode, and the cathode electrode CE may be a transmissive electrode. However, in a case in which the display panel 50 is a display panel emitting light at a rear surface thereof, the anode electrode AE may be a transmissive electrode, and the cathode electrode CE may be a reflective electrode.

The anode electrode AE is formed on the overcoat layer OC. The anode electrode AE may be made of a transparent conductive material such as indium tin oxide (ITO), indium zinc oxide (IZO), or zinc oxide (ZnO). When the anode electrode AE is a reflective electrode, the anode electrode AE may include a reflective layer. The reflective layer may be made of aluminum (Al), copper (Cu), silver (Ag), nickel (Ni) or an alloy thereof. In the embodiment, the reflective layer may be made of silver, palladium, or a copper alloy (APC).

A bank BNK is formed on the overcoat layer OC. The bank BNK may be a defining layer defining the light emitting part EA1 or EA2 of each of the sub-pixels R, G, B, and W. In the unit pixel P, the remaining area that excludes the light emitting part EA1 or EA2 may be defined as a non-light emitting part. The bank BNK may be formed of an organic film such as an acrylic resin, an epoxy resin, a phenolic resin, a polyamide resin, or a polyimide resin.

The bank BNK is formed to cover a part (for example, a portion of an edge) of the anode electrode AE, and the light emitting layer EML is formed at the exposed part of the anode electrode AE which is not covered by the bank BNK. The light emitting layer EML may have a multilayer thin film structure including a light generating layer. An area in which the light emitting layer EML is formed may be defined as the light emitting part EA1 or EA2 of each of the sub-pixels R, G, B, and W. In the light emitting part EA1 or EA2, the anode electrode AE, the light emitting layer EML, and the cathode electrode CE are stacked to be in direct contact with each other.

The cathode electrode CE is formed on the light emitting layer EML. The cathode electrode CE may be widely formed in the light emitting part EA1 or EA2 and the non-light emitting part. The cathode electrode CE may be formed of a transparent conductive material (TCO) which can transmit light therethrough or a semi-transmissive conductive material such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. When the cathode electrode CE is formed of the semi-transmissive conductive material, the light output efficiency of the cathode electrode may be increased due to a micro cavity thereof.

The circuit element and the light emitting diode can be covered by an encapsulation layer PAC. The encapsulation layer PAC prevents external moisture from being introduced into the circuit element and the light emitting diode. The encapsulation layer PAC may be formed of an inorganic insulating material or may be configured as a structure in which an inorganic insulating material and an organic insulating material are alternately stacked, but is not necessarily limited thereto.

A cover substrate 200 may be formed on the encapsulation layer PAC. The cover substrate 200 may be adhered on the encapsulation layer PAC through an adhesive.

A color filter CF may be formed between the encapsulation layer PAC and the cover substrate 200. The color filter CF may be disposed to overlap the light emitting part EA1 or EA2. The color filter CF is a wavelength-selective optical filter that passes light in a specific wavelength band therethrough and blocks light in other specific wavelength bands to selectively pass only incident light in a partial wavelength band therethrough, and may be made of a photosensitive resin including a colorant such as a pigment or dye. Light which is generated in the light emitting diode LD and passes through the color filter CF may have any one of red, green, and blue colors. The color filter CF for the sub-pixel W which displays a white color may be omitted.

A black matrix BM is formed between color filters CF and can prevent light leakage between the light emitting areas. In the embodiment of the present disclosure, the pixel part PA has the shape of a cross and thus the sub-pixels R, G, B, and W having colors different from each other are spaced apart from each other in different directions, so light leakage between the sub-pixels R, G, B, and W is reduced or minimized. Accordingly, the black matrix BM for the white sub-pixel W may be omitted.

In an area in which the white sub-pixel W is arranged, the color filter CF and the black matrix BM are omitted. Accordingly, the light emitting part EA1 or EA2 of the white sub-pixel W illustrated in FIG. 7 has a larger area than the light emitting parts EA1 and EA2 of other colored sub-pixels R, G, and B illustrated in FIG. 6. As the area of the light emitting part EA1 or EA2 of the white sub-pixel W increases, the loss of light emission of the white sub-pixel W is reduced or minimized and image quality thereof can be improved.

Particularly, when the color filter CF is omitted in the white sub-pixel W, the black matrix BM may be omitted between sub-pixels adjacent to the white sub-pixel W. In this case, in the unit pixel P, an area occupied by the black matrix BM may be remarkably decreased. As a result, the area of the transparent parts TA on the display panel 50 may be relatively increased, and the transparency of the display device can be effectively improved.

Figure 8:
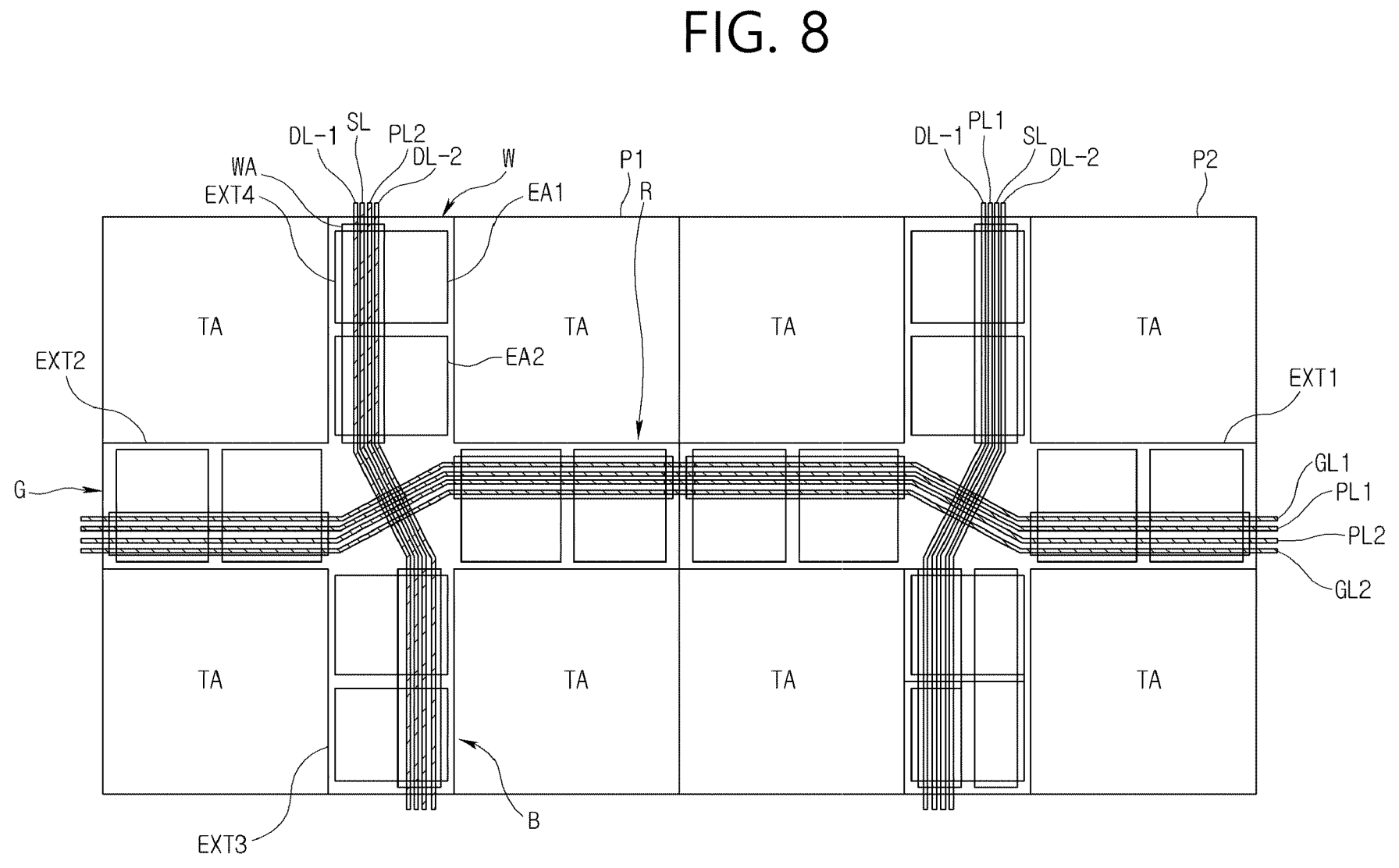

FIG. 8 is a top plan view roughly illustrating the structure of the unit pixel according to another embodiment.

In FIG. 8, two adjacent unit pixels P1 and P2 are illustrated. Each of the unit pixels P1 and P2 may include the sub-pixels R, G, B, and W that emit red, green, blue and white colored lights, respectively. Each of the sub-pixels R, G, B, and W may be arranged at a selected or predetermined position in the pixel part PA of each of the unit pixels P1 and P2. An area in which light is emitted by each of the sub-pixels R, G, B, and W may be defined as the light emitting part EA1 or EA2. The transparent part TA may be formed in each of the unit pixels P1 and P2.

The pixel part PA may have the shape of a cross. That is, the pixel part PA is provided with the first to fourth extension parts EXT1 to EXT4 extending in all directions. The sub-pixels R, G, B, and W may be arranged in the extension parts EXT1 to EXT4, respectively. For example, the red sub-pixel R may be arranged in the first extension part EXT1, the green sub-pixel G may be arranged in the second extension part EXT2, the blue sub-pixel B may be arranged in the third extension part EXT3, and the white sub-pixel W may be arranged in the fourth extension part EXT4.

The wiring part WA and at least one light emitting part EA1 or EA2 may be arranged in each of the extension parts EXT1 to EXT4.

The wiring part WA is arranged in an area of each of the extension parts EXT1 to EXT4. The wires are arranged in the wiring part WA to apply electrical signals to the circuit elements adjacent to the wiring part WA. For example, the wires may include the gate lines GL1 and GL2, the data line DL, the sensing line SL, and the power lines PL1 and PL2 described with reference to FIG. 2.

Each of the sub-pixels R, G, B, and W emits light through the light emitting diode LD arranged in the light emitting part EA1 or EA2. In the embodiment of the present disclosure, each of the sub-pixels R, G, B, and W may include two light emitting parts EA1 and EA2. The light emitting part EA1 or EA2 of a sub-pixel is arranged by overlapping the wiring part WA of the sub-pixel. When each of the sub-pixels R, G, B, and W has a plurality of light emitting parts EA1 and EA2, each of the plurality of the light emitting parts EA1 and EA2 may overlap the wiring part WA. Accordingly, when the light emitting parts EA1 and EA2 of a sub-pixel are arranged by overlapping the wiring part WA of the sub-pixel, the occurrence of the parasitic capacitor between adjacent sub-pixels can be prevented.

In the embodiment of the present disclosure, each of the extension parts EXT1 to EXT4 may have shape, area, and structure substantially similar to each other. That is, the circuit elements, the wires, and the light emitting diodes located in the extension parts EXT1 to EXT4 may have substantially similar shapes and areas and are arranged at the same location in each of the extension parts EXT1 to EXT4.

Instead, since the extension parts EXT1 to EXT4 extend in four different directions, respectively, each of the extension parts EXT1 to EXT4 has a shape and structure rotating about 90° relative to another extension part adjacent to the extension part. That is, the first extension part EXT1 has a shape rotating about 90° clockwise relative to the fourth extension part EXT4; the third extension part EXT3 has a shape rotating about 90° clockwise relative to the first extension part EXT1; the second extension part EXT2 has a shape rotating about 90° clockwise relative to the third extension part EXT3; and the fourth extension part EXT4 has a shape rotating about 90° clockwise relative to the second extension part EXT2.

In addition, the wires having the same shapes and structures in the extension parts EXT1 to EXT4 may apply the same signals or different signals. For example, the first and second gate lines GL1 and GL2 configured to apply the first and second gate signals and the power lines PL1 and PL2 may be arranged in the first and second extension parts EXT1 and EXT2, and the data line DL configured to apply the data signal and the sensing line SL configured to apply the reference voltage Vref may be arranged in the third and fourth extension parts EXT3 and EXT4.

Unlike the embodiment described with reference to FIG. 4, in the embodiment of the present disclosure, any one of the first power line PL1 and the second power line PL2 may be arranged in the third and fourth extension parts EXT3 and EXT4. For example, in any one of two adjacent unit pixels P1 and P2, the first power line PL1 may be arranged in the third and fourth extension parts EXT3 and EXT4, and in the remaining one of the two adjacent unit pixels P1 and P2, the second power line PL2 may be arranged in the third and fourth extension parts EXT3 and EXT4.

As described above, the extension parts EXT1 to EXT4 may have shapes substantially similar to each other, and both the first and second power lines PL1 and PL2 are arranged in the first and third extension parts EXT1 and EXT3. Accordingly, in the second and fourth extension parts EXT2 and EXT4 in which only any one of the first and second power lines PL1 and PL2 is arranged, the first or second power line PL1 or PL2 may be formed to have thicker width. Accordingly, the power lines PL1 and PL2 can be freely adjusted, so the display panel 50 according to the embodiment of the present disclosure can stably supply a drive voltage to the unit pixels P1 and P2.

Hereinafter, the planar structure of the pixel part PA according to the embodiment will be described in more detail with reference to the drawings.

Figure 9:
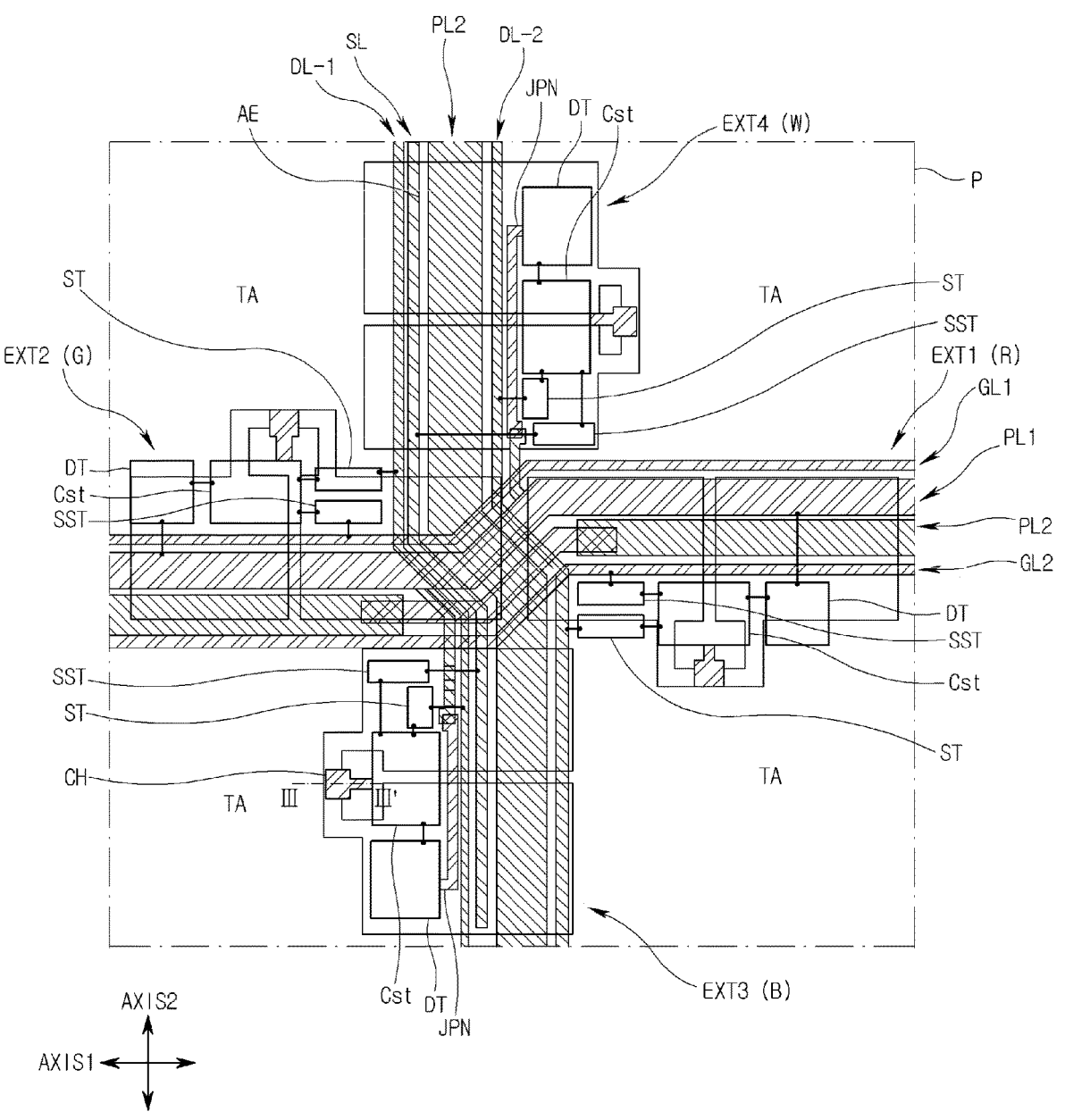
FIG. 9 is a top plan view illustrating, in detail, the structure of the unit pixel illustrated FIG. 8.

FIG. 9 is a top plan view illustrating, in detail, the structure of the unit pixel illustrated FIG. 8.

Referring to FIG. 9, the unit pixel P includes the pixel part PA in which the sub-pixels R, G, B, and W are arranged, and the transparent part TA which is the remaining area in which the sub-pixels R, G, B, and W are not arranged.

The pixel part PA may have a shape of a cross. As illustrated in the drawing, the pixel part PA includes the first and second extension parts EXT1 and EXT2 extending in directions opposite to each other along the first axis AXIS1, and the third and fourth extension parts EXT3 and EXT4 extending in directions opposite to each other along the second axis AXIS2 perpendicular to the first axis AXIS1.

The sub-pixels R, G, B, and W may be arranged in the extension parts EXT1 to EXT4, respectively. For example, the red sub-pixel R may be arranged in the first extension part EXT1, the green sub-pixel G may be arranged in the second extension part EXT2, the blue sub-pixel B may be arranged in the third extension part EXT3, and the white sub-pixel W may be arranged in the fourth extension part EXT4.

Each of the extension parts EXT1 to EXT4 may include: the light emitting part EA1 or EA2 in which the light emitting diode LD is arranged; the circuit elements (for example, a drive transistor DT, a switching transistor ST, a sensing transistor SST, and a storage capacitor Cst) configured to operate the light emitting diode LD; and the wiring part WA in which the wires (for example, a data line DL, a sensing line SL, and power lines PL1 and PL2) configured to apply electrical signals to the circuit elements are arranged. The circuit elements may control the amount of current applied to the light emitting diode LD in response to the electrical signals applied through the wires, and the light emitting diode LD may emit light with luminance corresponding to the amount of the current applied by the circuit elements.

The circuit elements are arranged in an area of each of the extension parts EXT1 to EXT4. The circuit elements may include the active layer constituting the transistors, the source, drain, and gate electrodes, and the electrodes constituting the capacitor. The transistors and the electrodes of the capacitor may be electrically connected with the wires formed in the wiring part WA through the contact hole.

In each of the extension parts EXT1 to EXT4, the wiring part WA is arranged in the remaining area in which the circuit elements are not arranged. The first and second gate lines GL1 and GL2 extending along the first axis AXIS1 and the data line DL and the sensing line SL extending along the second axis AXIS2 are arranged in the wiring parts WA, respectively. For example, the first and second gate lines GL1 and GL2 extend via the wiring parts WA of the first and second extension parts EXT1 and EXT2 extending along the first axis AXIS1, and the data line DL and the sensing line SL extend via the wiring parts WA of the third and fourth extension parts EXT3 and EXT4 extending along the second axis AXIS2.

The overlapping part may be formed at a point at which the first and second gate lines GL1 and GL2 and the data line DL/sensing line SL overlap with each other. In the embodiment, the data line DL and the sensing line SL arranged in each of the first and third extension parts EXT1 and EXT3 can be connected with circuit elements arranged in the second and fourth extension parts EXT2 and EXT4 through the contact hole formed in the overlapping part. Similarly, the data line DL and the sensing line SL arranged in second and fourth extension parts EXT2 and EXT4 can be connected with circuit elements arranged in the first and third extension parts EXT1 and EXT3 through the contact hole formed in the overlapping part.

The power lines PL1 and PL2 are arranged in the wiring part WA. Each of the first power line PL1 and the second power line PL2 may extend along the first axis AXIS1 and the second axis AXIS2 to have a mesh structure.

In the embodiment of the present disclosure, an extending pattern (the first pattern) of each of the first power line PL1 and the second power line PL2 relative to the first axis AXIS1 is arranged in all unit pixel rows. That is, the first pattern of each of the first power line PL1 and the second power line PL2 is arranged in the unit pixel rows via the first extension part EXT1 and the third extension part EXT3.

The extending pattern (the second pattern) of each of the first power line PL1 and the second power line PL2 relative to the second axis AXIS2 is alternately arranged in unit pixel columns. For example, the second pattern of the first power line PL1 is arranged in an $i^{th}$ unit pixel column, and the second pattern of the second power line PL2 is arranged in an i+1$^{th}$ unit pixel column. The second pattern is arranged via the second extension part EXT2 and the fourth extension part EXT4 having the unit pixel columns. The first power line PL1 and the second power line PL2 can be connected with the circuit elements through the contact hole formed in the overlapping part or each of the extension parts EXT1 to EXT4.

In the embodiment, in a unit pixel in which the first pattern of the first power line PL1 or the second power line PL2 is not provided, a separate pattern may be beneficial such that the high potential drive voltage ELVDD or the low potential drive voltage ELVSS can be applied to the drive transistors DT of the third extension part EXT3 and the fourth extension part EXT4.

In the embodiment, in a unit pixel in which the first pattern of the first power line PL1 is not provided, a jumping line JPN which connects the second pattern of the first power line PL1 with the drive transistor DT may be provided therebetween.

The jumping line JPN may extend in the direction of the second axis AXIS2. According to an embodiment, the jumping line JPN may have a shape in which at least one part thereof is bent. In the embodiment, the jumping line JPN may be configured to include at least two patterns connected thereto through the contact hole, but is not limited thereto in the embodiment of the present disclosure.

A first end of the jumping line JPN is connected to the second pattern of the first power line PL1 in the overlapping part, and a second end of the jumping line JPN may be connected to the drain electrode of the drive transistor DT arranged in an extension part (for example, the third extension part EXT3 or the fourth extension part EXT4) in which the jumping line JPN is provided. In this case, the high potential drive voltage ELVDD applied through the first power line PL1 can be transmitted to each of unit pixels which extend in the direction of the first axis AXIS1 and do not include the first pattern of the first power line PL1, that is, to the third extension part EXT3 and the fourth extension part EXT4.

The light emitting part EA1 or EA2 is arranged on the circuit elements and the wiring part WA by overlapping the circuit elements and the wiring part WA. The light emitting diode LD is arranged in the light emitting part EA1 or EA2. In the embodiment of the present disclosure, each of the sub-pixels R, G, B, and W may include two light emitting parts EA1 and EA2. The light emitting parts EA1 and EA2 are electrically connected to the drive transistor DT and receive drive current via the drive transistor DT.

Hereinafter, the connection relation of the circuit elements will be briefly described.

The first electrode of the drive transistor DT can be connected to the first power line PL1, and the second electrode of the drive transistor DT can be connected to the anode electrode AE via the first electrode of the storage capacitor Cst. The gate electrode of the drive transistor DT can be connected to a second electrode of the storage capacitor Cst.

The first electrode of the switching transistor ST can be connected to the data line DL-1, and the second electrode of the switching transistor ST can be connected to the gate electrode of the drive transistor DT via the second electrode of the storage capacitor Cst. The gate electrode of the switching transistor ST can be connected to the first gate line GL1.

The first electrode of the sensing transistor SST can be connected to the sensing line SL, and the second electrode of the sensing transistor SST can be connected to the first electrode of the storage capacitor Cst. The gate electrode of the sensing transistor SST can be connected to the second gate line GL2.

As described above, in a pixel PX in which the first pattern of the first power line PL1 is not provided, the drive transistors DT arranged in the third extension part EXT3 and the fourth extension part EXT4 can be connected to the second pattern of the first power line PL1 through the jumping line JPN.

Figure 10:
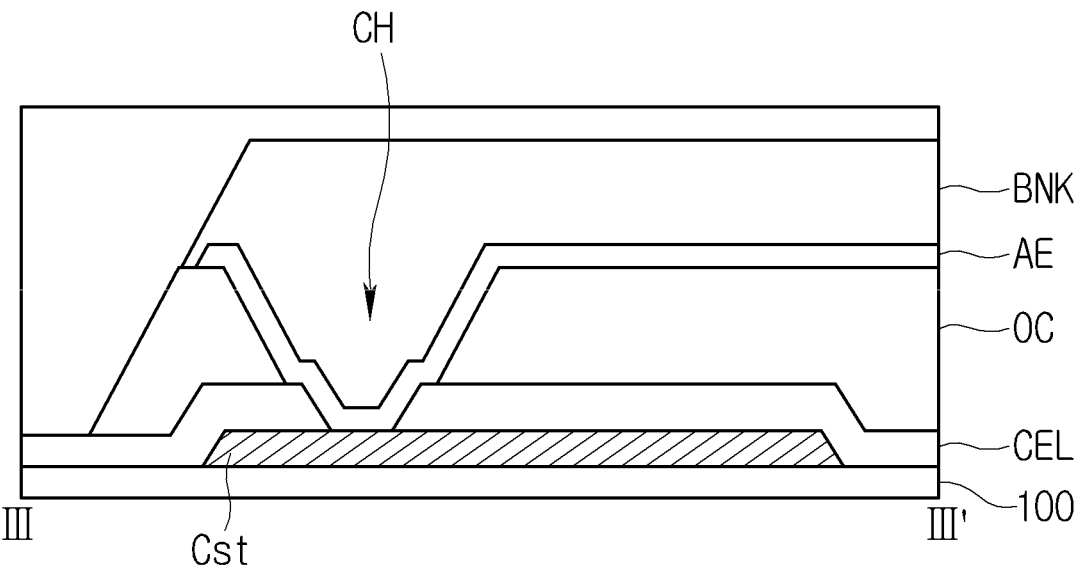
FIG. 10 is a sectional view taken along line of FIG. 9.

FIG. 10 is a sectional view taken along line of FIG. 9.

Referring to FIGS. 9 and 10, the anode electrode AE has an extension part extending toward the transparent part TA. When the anode electrode AE includes a plurality of anode electrodes, each of the plurality of anode electrodes has an extension part extending toward the transparent part TA, and these extension parts can be connected with each other.

In addition, the first electrode (for example, a lower electrode) of the capacitor Cst has an extension part extending toward the transparent part TA. The extension part of the anode electrode AE is arranged to overlap the extension part of the capacitor Cst.

The contact hole CH is formed in an area at which the extension part of the anode electrode AE and the extension part of the capacitor Cst overlap each other. The contact hole CH is formed to expose one area of the first electrode of the capacitor Cst. The anode electrode AE can be connected with the first electrode of the capacitor Cst through the contact hole CH.

The first extension part EXT1 and the second extension part EXT2 may be connected to a first extension line SEL1 and a second extension line SEL2, respectively, through a first contact hole CH1 and a second contact hole CH2, respectively.

Such a structure may be used to repair pixels PX. In the embodiment, when one of the light emitting parts EA1 and EA2 malfunctions, the drive transistor DT is electrically disconnected from the associated anode electrode. For example, the disconnection can be performed through laser cutting. For an example, a laser is emitted to the extension part of the anode electrode in which defect has occurred so as to perform the laser cutting. In the light emitting parts EA1 and EA2, the anode electrodes operate individually. Accordingly, even if one anode electrode is disconnected from the storage capacitor Cst, another anode electrode can operate normally.

Although the embodiments of the present disclosure have been described above with reference to the accompanying drawings, it will be understood that the technical configuration of the display device of the present disclosure may be embodied in other specific forms by those skilled in the art to which the present disclosure pertains without changing the technical spirit or essential features of the present disclosure. Therefore, it should be understood that the embodiments described above are illustrative in all respects and not restrictive. In addition, the scope of the present disclosure is indicated by the claims to be described later rather than by the above detailed description. In addition, all changes or modifications derived from the meaning and scope of the claims and their equivalent concepts should be construed as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a pixel part in which sub-pixels are arranged, and at least one transparent part arranged in an area adjacent to the pixel part and passing external light therethrough, wherein the pixel part includes first to fourth extension parts extending in directions different from each other, wherein the sub-pixels are arranged in the first to fourth extension parts, respectively, at least two extension parts cross other at least two extension parts, wherein the at least one transparent part is arranged between at least two light emitting parts disposed on at least two different ones of the first to fourth extension parts, wherein each of the first to fourth extension parts comprise:

a circuit part in which circuit elements are arranged;

a wiring part in which wires configured to apply electrical signals to the circuit elements are arranged; and at least one light emitting part arranged by overlapping each of the circuit part and the wiring part and including a light emitting diode, and wherein the wires comprise:

a first power line configured to apply a first potential drive voltage to the sub-pixels, and a second power line configured to apply a second potential drive voltage to the sub-pixels, wherein the first potential drive voltage is greater than the second potential drive voltage, wherein each of the first power line and the second power line includes a second pattern extending along a second axis via a wiring part of each of the third extension part and the fourth extension part, and at least one of the first power line and the second power line includes a first pattern extending along a first axis overlapping with the second axis via a wiring part of each of the first extension part and the second extension part.

2. The display device of claim 1, wherein each of the first to fourth extension parts has shape and structure rotating about 90° relative to adjacent extension parts.

3. The display device of claim 2, wherein the at least one transparent part has a shape of a square in which two sides are defined by two adjacent extension parts of the first to fourth extension parts.

4. The display device of claim 2, wherein the wires comprise:

a first power line configured to apply a first potential drive voltage to the sub-pixels, and a second power line configured to apply a second potential drive voltage to the sub-pixels, wherein the first potential drive voltage is greater than the second potential drive voltage, wherein each of the first power line and the second power line includes a first pattern extending along a first axis via a wiring part of each of the first extension part and the second extension part, and wherein at least one of the first power line and the second power line includes a second pattern extending along a second axis overlapping with the first axis via a wiring part of each of the third extension part and the fourth extension part.

5. The display device of claim 4, wherein when any one of the first power line and the second power line comprises the second pattern, the second pattern has a width larger than a width of the first pattern.

6. The display device of claim 2, wherein the wires comprise:

a gate line configured to apply a gate signal to the sub-pixels and to extend along the first axis, and a data line configured to apply a data signal to the sub-pixels and to extend along the second axis overlapping with the first axis.

7. The display device of claim 6, wherein the data line comprises:

a first sub-data line connected with sub-pixels arranged in some portions of the first to fourth extension parts, and a second sub-data line arranged by being spaced apart from the first sub-data line and connected with sub-pixels arranged in the remaining portions of the first to fourth extension parts.

8. The display device of claim 1, wherein the pixel part comprises:

a substrate on which red, green, blue, and white sub-pixels are arranged;

a color filter arranged by corresponding to the light emitting part of each of the red, green, and blue sub-pixels; and a black matrix arranged between adjacent color filters, wherein the black matrix is not arranged on the white sub-pixel.

9. A transparent display device comprising:

a display panel in which unit pixels are arranged, wherein each of the unit pixels includes:

a pixel part in which sub-pixels are arranged, and at least one transparent part arranged in an area adjacent to the pixel part and passing external light therethrough, wherein the pixel part includes first to fourth extension parts extending in directions different from each other, wherein the sub-pixels are arranged in the first to fourth extension parts, respectively, wherein at least two extension parts overlap other at least two extension parts, wherein the at least one transparent part is arranged between at least two light emitting parts disposed on at least two different ones of the first to fourth extension parts, wherein the first to fourth extension parts comprise:

a circuit part in which circuit elements are arranged;

a wiring part in which wires configured to apply electrical signals to the circuit elements are arranged; and at least one light emitting part arranged by overlapping each of the circuit part and the wiring part and including a light emitting diode, and wherein the wires comprise:

a first power line configured to apply a first potential drive voltage to the sub-pixels, and a second power line configured to apply a second potential drive voltage to the sub-pixels, wherein the first potential drive voltage is greater than the second potential drive voltage, and wherein each of the first power line and the second power line includes a first pattern extending along a first axis and a second pattern extending along a second axis to have a mesh structure.

10. The transparent display device of claim 9, wherein each of the first to fourth extension parts has shape and structure rotating about 90° relative to adjacent extension parts.

11. The transparent display device of claim 9, wherein the first pattern of each of the first power line and the second power line is arranged via a wiring part of each of the first extension part and the second extension part, and the second pattern of each of the first power line and the second power line is arranged via a wiring part of each of the third extension part and the fourth extension part.

12. The transparent display device of claim 9, wherein the first pattern of each of the first power line and the second power line is arranged in each of unit pixel rows, and the second pattern of each of the first power line and the second power line is alternately arranged in each of unit pixel columns.

13. The transparent display device of claim 9, wherein the pixel part comprises:

a substrate on which red, green, blue, and white sub-pixels are arranged;

a color filter arranged by corresponding to the light emitting part of each of the red, green, and blue sub-pixels; and a black matrix arranged between adjacent color filters, wherein the black matrix is not arranged on the white sub-pixel.

14. A display device comprising:

a pixel part in which sub-pixels are arranged, and at least one transparent part arranged in an area adjacent to the pixel part and passing external light therethrough, wherein the pixel part includes first to fourth extension parts extending in directions different from each other, wherein the sub-pixels are arranged in the first to fourth extension parts, respectively, wherein at least two extension parts overlap other at least two extension parts, and wherein the at least one transparent part is arranged between at least two light emitting parts disposed on at least two different ones of the first to fourth extension parts, wherein the first to fourth extension parts comprise:

a circuit part in which circuit elements are arranged;

a wiring part in which wires configured to apply electrical signals to the circuit elements are arranged; and at least one light emitting part arranged by overlapping each of the circuit part and the wiring part and including a light emitting diode, and wherein the wires comprise:

a first power line configured to apply a first potential drive voltage to the sub-pixels, and a second power line configured to apply a second potential drive voltage to the sub-pixels, wherein the first potential drive voltage is greater than the second potential drive voltage, and wherein each of the first power line and the second power line includes a first pattern extending along a first axis and a second pattern extending along a second axis to have a mesh structure.

* * * * *